United States Patent
Erickson et al.

(10) Patent No.: US 8,691,341 B2
(45) Date of Patent: Apr. 8, 2014

(54) METHOD OF CONTROLLING THE HEIGHT OF ENCAPSULANT ON AN INKJET PRINTHEAD

(75) Inventors: Neal D. Erickson, Lexington, KY (US); Kirk L. Stechschulte, Lexington, KY (US); Steven R. Komplin, Lexington, KY (US); Ronald W. Bunn, Nicholasville, KY (US); Richard L. Warner, Lexington, KY (US); Girish S. Patil, Lexington, KY (US); Kyle B. Freels, Georgetown, KY (US)

(73) Assignee: Lexmark International, Inc., Lexington, KY (US)

( * ) Notice: Subject to any disclaimer, the term of this patent is extended or adjusted under 35 U.S.C. 154(b) by 214 days.

(21) Appl. No.: 13/249,520

(22) Filed: Sep. 30, 2011

(65) Prior Publication Data
US 2013/0084397 A1    Apr. 4, 2013

(51) Int. Cl.
*B05D 3/12* (2006.01)

(52) U.S. Cl.
USPC ........ 427/369; 438/124; 438/127; 427/372.2; 427/376.1

(58) Field of Classification Search
USPC ............ 347/6, 9, 20, 44, 47, 60, 67, 102; 427/355, 398.1, 398.2; 438/106, 124, 438/127
See application file for complete search history.

(56) References Cited

U.S. PATENT DOCUMENTS

| | | | |
|---|---|---|---|
| 6,267,472 B1 * | 7/2001 | Maher et al. | 347/65 |
| 6,359,335 B1 * | 3/2002 | Distefano et al. | 257/707 |
| 6,459,163 B1 | 10/2002 | Bai | |
| 7,074,651 B2 * | 7/2006 | Lien | 438/112 |
| 7,121,647 B2 | 10/2006 | Smoot | |
| 7,618,842 B2 | 11/2009 | Chung-Long-Shan | |
| 7,811,863 B1 * | 10/2010 | Lin et al. | 438/122 |
| 2004/0195687 A1 * | 10/2004 | Inoue et al. | 257/738 |

OTHER PUBLICATIONS

S. J. Adamson and D Gibson, Asymtek, Precision Dispensing of Liquid Encapsulants for Smart Cards. IMAPS Europe-13 Harrogate, Yorkshire, UK, Jun. 1999 http//www-car.asymtek.com/jp/news/articles/1999_06_imaps_smartcard_dam_and_fill.pdf.

* cited by examiner

*Primary Examiner* — Alexander Weddle

(57) ABSTRACT

A method of controlling a height of an encapsulant material on an inkjet printhead is provided. The method includes dispensing the encapsulant material on an outer portion of the inkjet printhead. The encapsulant material is then depressed to reduce its height on the outer portion of the inkjet printhead. The encapsulant material may be depressed directly after dispensing or before it completely cures. The encapsulant material may be completely cured before reducing its height. The height of the cured encapsulant material may be reduced by removing a top portion of the encapsulant material through machining operation. Reducing the height of the encapsulant material on the inkjet printhead minimizes the distance of the nozzle plate of the inkjet printhead to the printing media, thus improving print quality.

21 Claims, 5 Drawing Sheets

METHOD OF CONTROLLING THE HEIGHT OF ENCAPSULANT ON AN INKJET PRINTHEAD

FIELD OF THE DISCLOSURE

The present disclosure relates to micro-fluid ejection devices, such as inkjet printers. More particularly, although not exclusively, it relates to controlling a height of an encapsulant on an inkjet printhead. Method of reducing the height of the encapsulant facilitates certain designs.

BACKGROUND

A printhead assembly, employed in an inkjet printer, generally includes a heater chip and a flexible circuit being attached on a substrate. A nozzle plate may be disposed on the heater chip. The heater chip may be electrically connected to the flexible circuit through tape automated bonding (TAB) techniques or wire bonding procedures. These electrical connections, which are usually made of metals, should be protected from contact with ink to prevent corrosion. This protection may be provided by encapsulating the electrical connection with corrosion resistant material such as an epoxy-based encapsulant.

To maximize print quality, distance of the nozzle plate of the printhead assembly from the printing media such as paper, which may hereinafter be termed as media gap, should be minimized. But one factor that may limit the reduction of the media gap is the height of the encapsulant that covers the electrical connections of the printhead assembly. Another limiting factor is the cockle phenomenon which occurs when printing media wrinkles or deflects toward the printhead assembly upon depositing the ink. If the combination of the height of the encapsulant measured relative to the surface of the nozzle plate and the cockling height of the printing media exceeds the media gap, the printing media disposed with ink will probably rub on the encapsulant causing the ink to smear across the printing media. The media gap may not be reduced without considering the height of the encapsulant and the effect of cockle phenomenon, thus hindering improvement on print quality.

One known process of encapsulating the electrical connection of the printhead assembly is by dispensing an encapsulant material using a discharge needle. In using this process, the final height of the encapsulant relative to the nozzle plate is typically undesirably high, and encapsulant height variation may be present. Making changes on the dispense process have been so far unsuccessful in providing better control of the encapsulant height. This may be due to the transient properties of the encapsulant material. The properties of the encapsulant material may change with temperature, humidity, and age. The problem may be solved if a more stable encapsulant material which still prevents corrosion is discovered. But to date, encapsulant materials that may be easy to manufacture are not sufficiently corrosion resistant.

Another factor that contributes to the variation of the height of the encapsulant may be the variation of the dispensing volumes of the encapsulant material. Normal tolerances of the components of the dispensing assembly creating the dispensing volume of the encapsulant material may result to the variation of the volume of the encapsulant material being dispensed. So, even with very precise metering and more stable encapsulant materials, height variation may still be at unacceptable levels.

Commonly assigned U.S. Pat. No. 7,121,647 B2 describes another method of encapsulating the electrical connections of the printhead assembly. The encapsulant material is provided on the printhead assembly through stencil printing. This process has the ability to apply more consistent layer of encapsulant at precise locations. But the ability to reduce encapsulant height has not been demonstrated. In this process, the encapsulant material may have the tendency to stick or wick out on the stencil which may possibly result in contamination.

U.S. Pat. No. 7,618,842 B2 illustrates a technique for reducing the height of the encapsulant. A profiling surface such as a blade is used to wipe the top portion of the encapsulant before the encapsulant has cured. The profiling surface moves across the wet encapsulant and displaces the top portion of the encapsulant to the flexible printed circuit board side to flatten the top portion of the encapsulant. This technique may have the tendency to splatter some encapsulant residues on adjacent surfaces of the printhead assembly or stick some encapsulant residues on the profiling surface which may lead to contamination.

Accordingly, a need exists in the art to reduce the height of the encapsulant of the printhead assembly without removing any wet encapsulant or contaminating adjacent surfaces of the printhead assembly. The need extends to reducing media gap and improving print quality. Additional benefits and alternatives are also sought when devising solutions.

SUMMARY

The above-mentioned and other problems become solved with a method of controlling the height of the encapsulant material on the inkjet printhead before the encapsulant material completely cures and/or after the encapsulant material completely cures.

In one embodiment, the height of the encapsulant material is controlled by depressing the encapsulant material from a first height to a second height lower than the first height. The encapsulant material is dispensed on the outer portion of the inkjet printhead covering the electrical connections to the first height. It is then depressed to the second height directly after dispensing, after an initial curing, or before it completely cures.

A depressing plate may be used to depress the encapsulant material. The depressing plate may have a flat, shaped or patterned bottom surface to contact with the top portion of the encapsulant material. It may quickly contact with at least a portion of the exposed or top surface of the encapsulant material, or it may remain in contact with the encapsulant material during the curing stage. A sacrificial layer may be provided on the bottom surface of the depressing plate or top surface of the encapsulant material to prevent the encapsulant material from adhering on the depressing plate. The depressing plate may then be removed from contact with the encapsulant material in a twisting or sliding motion.

In another embodiment, the height of the encapsulant material is controlled by removing the top portion of the cured encapsulant material. A machining operation such as grinding or milling may be used to remove the top portion of the cured encapsulant material.

These and other embodiments are set forth in the description below. Their advantages and features will become readily apparent to skilled artisans. The claims set forth particular limitations.

BRIEF DESCRIPTION OF THE DRAWINGS

The accompanying drawings incorporated in and forming a part of the specification, illustrate several aspects of the present disclosure, and together with the description serve to explain the principles of the disclosure. In the drawings.

DETAILED DESCRIPTION OF THE ILLUSTRATED EMBODIMENTS

In the following detailed description, reference is made to the accompanying drawings where like numerals represent like details. The embodiments are described in sufficient detail to enable those skilled in the art to practice the disclosure. It is to be understood that other embodiments may be utilized and that process, electrical, and mechanical changes, etc., may be made without departing from the scope of the disclosure. The following detailed description, therefore, is not to be taken in a limiting sense and the scope of the disclosure is defined only by the appended claims and their equivalents. In accordance with the features of the disclosure, the height of an encapsulant material on an inkjet printhead may be controlled before the encapsulant material completely cures and/or after the encapsulant material completely cures.

Figure 1:
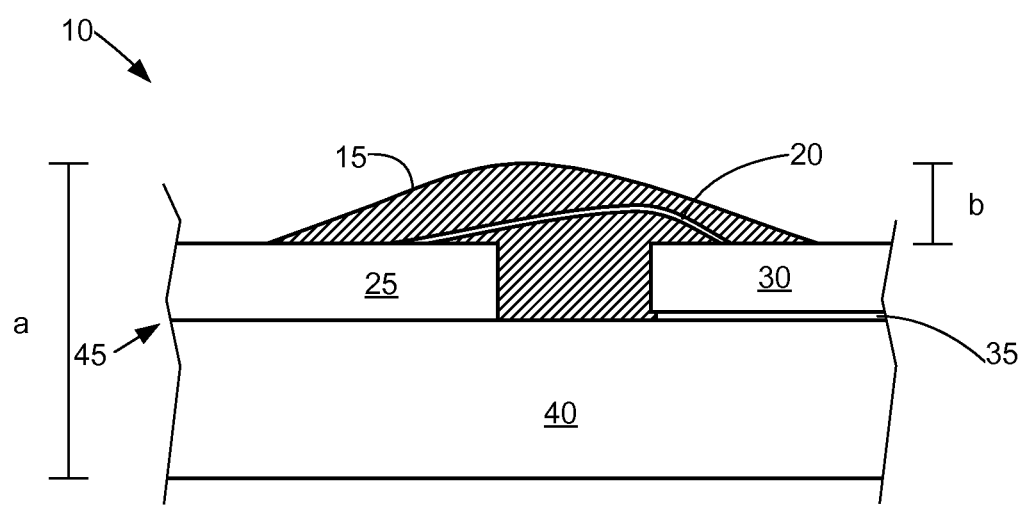
FIG. 1 is a partial cross-sectional view of a printhead assembly with uncontrolled encapsulant height.
Figure 2:
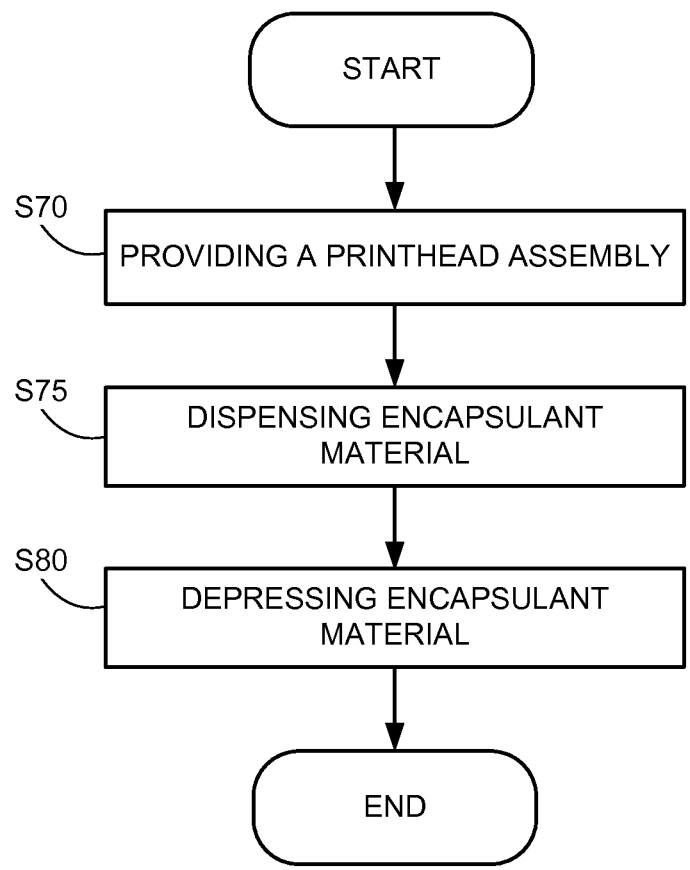
FIG. 2 is a schematic flow diagram showing a method of controlling the height of encapsulant material according to one embodiment.

FIG. 2 shows a schematic flow diagram of a method of controlling the height of the encapsulant material on the inkjet printhead according to one embodiment. At S70, the printhead assembly is provided. With reference to FIG. 1, the printhead assembly 10 may have an outer portion 45 including a heater chip 30 and a flexible circuit 25. The heater chip 30 and the flexible circuit 25 may be separately attached on a substrate 40 of the printhead assembly 10. The heater chip 30 may be attached on the substrate 40 through a die bond adhesive 35. A nozzle plate (not shown) may be attached on the heater chip 30. In order to control an operation of the heater chip 30, it may be connected to a print controller through the flexible circuit 25. The heater chip 30 may include at least one bond pads (not shown) for electrical connections. The flexible circuit 25 may include at least one electrical traces (not shown) for electrical connection. The at least one of the electrical traces of the flexible circuit 25 may be coupled to the at least one of the bond pads of the heater chip 30 through tape automated bonding technique or wire bonding procedure.

At S75, the encapsulant material 15 is dispensed on the outer portion 45 of the printhead assembly 10 to cover and protect the electrical connections. The encapsulant material 15 may comprise a polymeric material which, after it substantially solidify or cure, may form an effective mechanical and chemical protective encapsulant to the electrical connections. These electrical connections may include the electrical traces of the flexible circuit 25, bond pads of the heater chip 30, and connecting wires 20 coupling the electrical traces with the bond pads.

The encapsulant material 15 may be dispensed to a first height. With reference to FIG. 1, the first height may be measured from the bottom surface of the substrate 40 to a maximum point of coverage of the encapsulant material 15 as indicated by the first height a, or it may be measured from the top surface of the heater chip 30 to the maximum point of coverage of the encapsulant material 15 as indicated by the first height b, or by other measurement techniques.

Figure 5A:
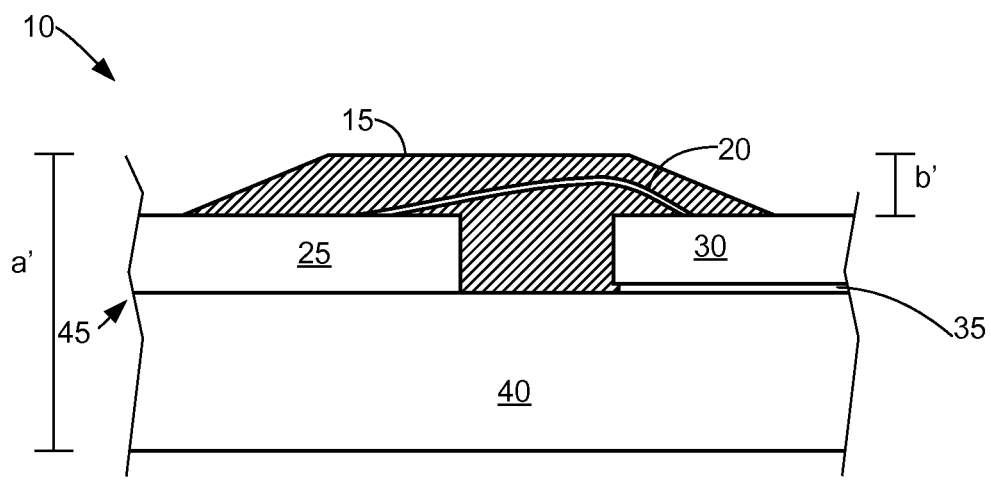
FIGS. 5A-5B are partial cross-sectional views of the printhead assembly with reduced encapsulant height.
Figure 5B:
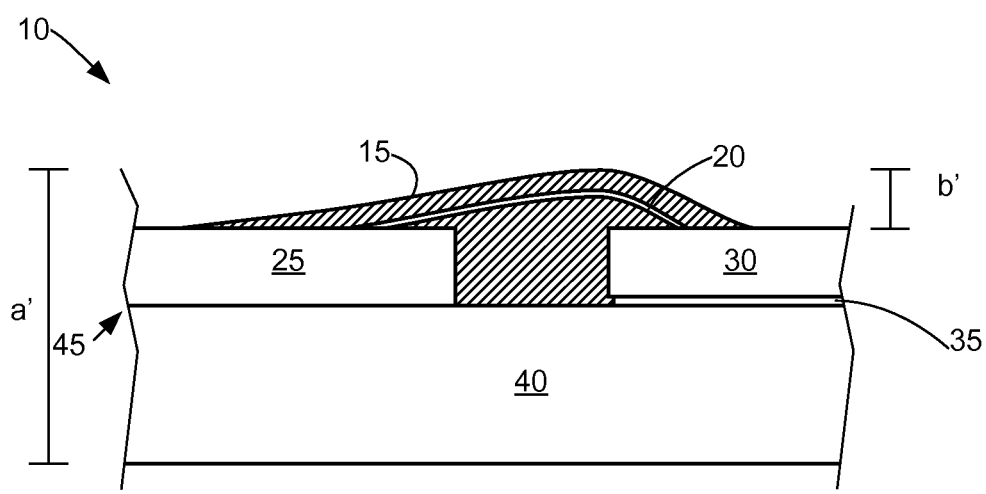

In this embodiment, the height of the encapsulant material 15 is controlled before it completely cures. A force may be applied to press the encapsulant material 15 to a desired or predetermined height, which may hereinafter be referred to as a second height. FIGS. 5A-5B illustrate the printhead assembly 10 having encapsulant material 15 with controlled height, as shown, the second height may be measured relative to the top surface of the heater chip 30 to include the maximum wire loop height (or TAB thickness) and the minimum coverage height of the encapsulant material 15, as indicated by second height b', or it may be measured relative to the bottom surface of the substrate 40, as indicated by second height a'. The second height b' may provide the minimum encapsulant height to prevent corrosion. The second height a' may include the nominal wire loop height (or TAB thickness) from the bottom surface of the substrate 40, thickness tolerances of the printhead assembly and minimum coverage height of the encapsulant material 15. This second height a' may provide a stable measurement for encapsulant height, which provides a stable basis for measurement of media gap.

At S80, the encapsulant material 15 on the outer portion 45 of the printhead assembly 10 is depressed to the second height a' or b' being lower than the first height a or b respectively. The depressing of the encapsulant material 15 may be performed directly after dispensing the encapsulant material 15. In some example embodiment, the encapsulant material 15 may be depressed after an initial cure stage such as with encapsulant material 15 comprising B-stage epoxies.

Figure 3A:
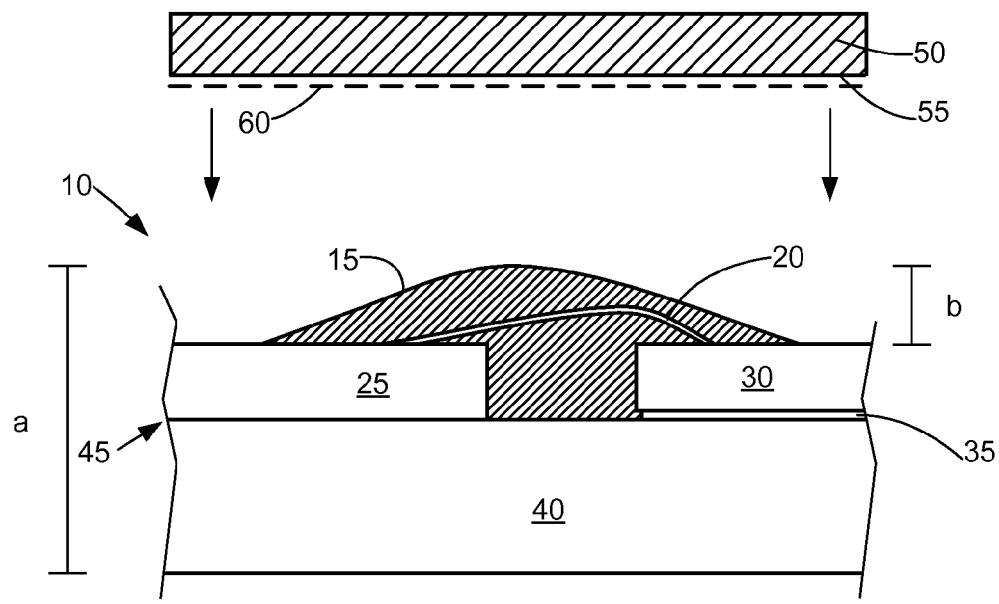
FIGS. 3A-3B are diagrammatic views showing a method of depressing the height of encapsulant material according to one embodiment.
Figure 3B:
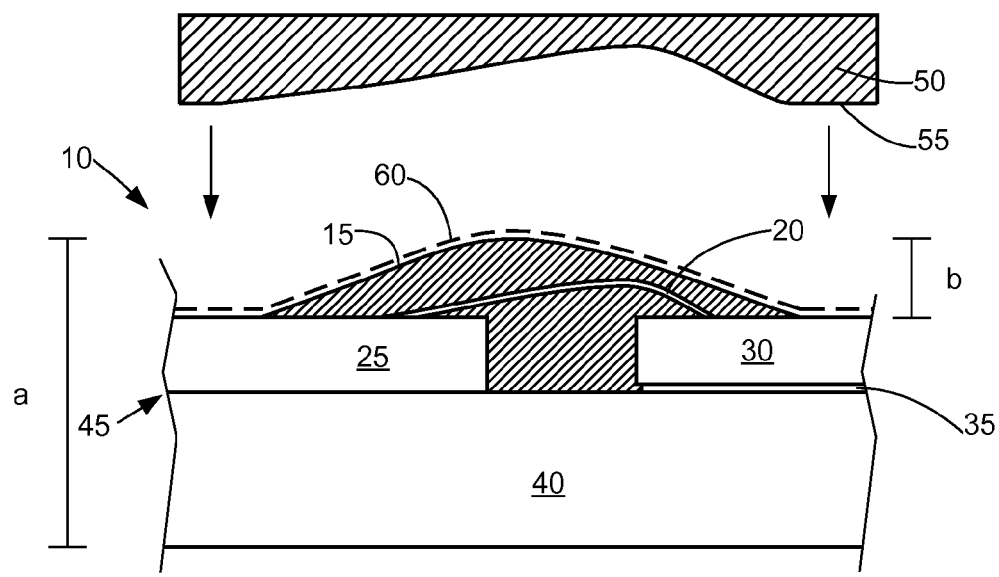

With reference to FIGS. 3A-3B, the depressing of the encapsulant material 15 may be performed using a depressing plate 50. The depressing plate 50 has a bottom surface 55 contacting at least a portion of the top surface or exposed surface of the encapsulant material 15. With reference to FIG. 3A, the bottom surface 55 of the depressing plate 50 may be flat. With reference to FIG. 3B, the bottom surface 55 of the depressing plate 50 may be shaped or patterned. The depressing plate 50 may be made of a rigid and durable material that may withstand the curing conditions of the encapsulant material 15. It may be made of a metal, glass, plastic, etc.

At S80, the depressing plate 50 may quickly contact the encapsulant material 15 such as contacting the encapsulant material 15 for at most 1 minute. The depressing plate 50 may remain in contact with the encapsulant material 15 during the curing stage or until the encapsulant material 15 completely cures. For example, the depressing plate 50 may remain in contact with the encapsulant material 15 until the top surface of the encapsulant material 15 cures. In some example embodiments, the depressing plate 50 may be heated while in contact with the encapsulant material 15 to further assist the curing of the encapsulant material 15.

In some other example embodiments, the depressing plate 50 may be chilled before contacting the encapsulant material 15. Applying the chilled depressing plate 50 may make the surface of the encapsulant material 15 less tacky and allow for a clean release of the depressing plate 50 from contact with the surface of the encapsulant material 15. It may also increase the encapsulant viscosity which helps prevent the encapsulant material 15 from forming a meniscus on the surface of the depressing plate 50. Depressing using the chilled depressing plate 50 may be conducted in a low dew point or low pressure environment to prevent condensation of moisture from the environment. The encapsulant material 15 may be over pressed when using the chilled depressing plate 50 which then provides the encapsulant material 15 an allowance for movement during the curing process.

In depressing the encapsulant material 15 at S80, a sacrificial layer 60 may be provided to prevent the encapsulant material 15 from adhering on the depressing plate 50. With reference to FIG. 3A, the sacrificial layer 60 may be optionally placed on the bottom surface 55 of the depressing plate 50. With reference to FIG. 3B, the sacrificial layer 60 may be optionally placed on the top surface of the encapsulant material 15. The sacrificial layer 60 placed on the top surface of the encapsulant material 15 may be removed after curing the encapsulant material 15. Polytetrafluoroethylene film may be used as the sacrificial layer 60. This film may be commercially available under the trade name TEFLON.

In removing the depressing plate 50 from contact with the encapsulant material 15, a sudden or direct pull of the depressing plate 50 away from the encapsulant material 15 may raise the encapsulant height. The depressing plate 50 may then be removed from contact with the encapsulant material 15 in a twisting or sliding motion.

Figure 4:
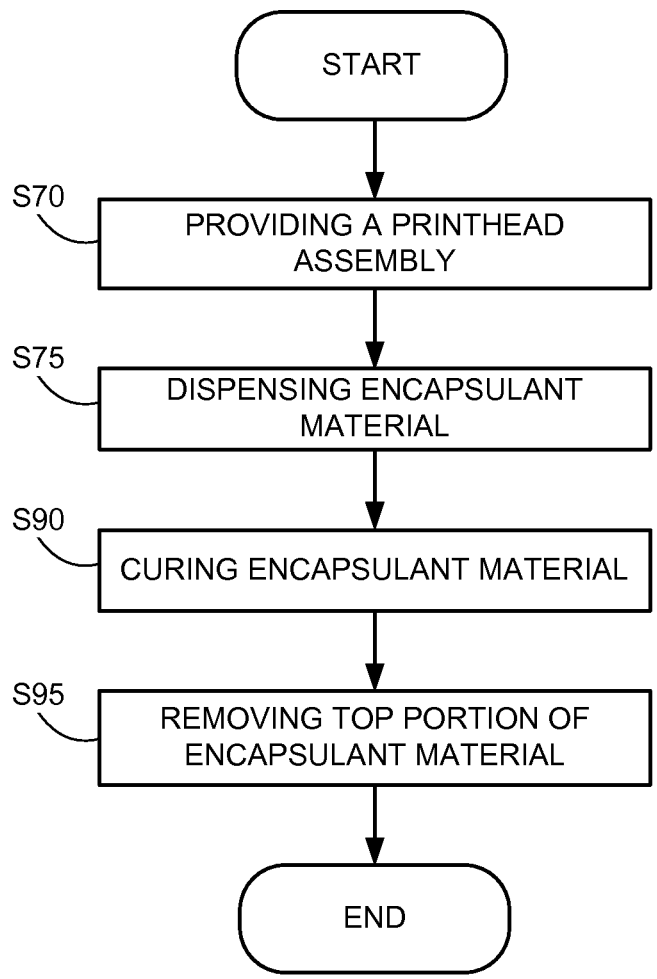
FIG. 4 is a schematic flow diagram showing a method of controlling the height of encapsulant material according to another embodiment.

FIG. 4 shows a schematic flow diagram of a method of controlling the height of the encapsulant material 15 on the inkjet printhead according to another embodiment. In this other embodiment, the height of the encapsulant material 15 is controlled after curing the encapsulant material 15. At S75, the encapsulant material 15 is dispensed on the outer portion 45 of the printhead assembly 10. The encapsulant material 15 may include filler for increasing its shear strength and minimizing occurrence of chipping or flaking during a succeeding machining process. The amount of filler may be about 1% to about 5% by weight of the encapsulant material. The filler may be selected from the group consisting of nitrides, silicates and oxide. It may include but is not limited to fumed silica, boron nitride, arsenic pentoxide, arsenic trioxide, vanadium pentaoxide, barium oxide, and magnesium oxide.

At S90, the encapsulant material 15 is fully cured. The encapsulant material 15 may be cured according to one or more of the following cure mechanisms: thermal cure, photosensitive cure, microwave cure, infrared cure, moisture cure, and/or room temperature cure.

At S95, the height of the fully cured encapsulant material 15 is then controlled to the second height a' or b' by removing a top portion of the fully cured encapsulant material 15. The top portion of the encapsulant material 15 may be removed through machining such as grinding, vertical milling or horizontal milling. Operating parameters such as feed rate, tool speed, and depth of cut during the machining, may control the final surface finish of the encapsulant material 15 and size of the debris. The debris may be removed by flushing the printhead assembly with water during or after the machining operation. During the flushing of water, the nozzle holes of the printhead assembly 10 should be sealed to prevent the mixture of water and debris from flowing into the ink path of the printhead assembly 10. The machining operation may not only reduce the encapsulant height but it may further provide the final surface finish and profile of the encapsulant material 15.

FIGS. 5A-5B show example profiles of the encapsulant material 15 on the printhead assembly 10 after applying the depressing operation described by S80 and/or machining operation described by S95. The encapsulant profile shown in FIG. 5A may be achieved by depressing the encapsulant material 15 before completely curing using the depressing plate 50 having flat bottom surface 55 as illustrated in FIG. 3A. This encapsulant profile shown in FIG. 5A may also be achieved through constant height machining operation of the completely cured encapsulant material 15.

The encapsulant profile shown in FIG. 5B may be achieved by depressing the encapsulant material 15 before completely curing using the depressing plate 50 having shaped bottom surface 55 as illustrated in FIG. 3B. This encapsulant profile shown in FIG. 5B may be also achieved through complex machining operation of the completely cured encapsulant material 15. The shaped encapsulant profile such as that shown in FIG. 5B may have no sharp corners thus preventing wearing out of a printhead wiper. The use of depressing plate 50 having shaped bottom surface 55 or complex machining operation allows the encapsulant profile to be matched with the deflection of the printhead wiper which provides convenience to printhead wiping and results to less ink pooling on the nozzle plate surface.

The encapsulant profiles shown in FIGS. 5A-5B may be also achieved by applying both the depressing operation and machining operation. The machining operation may be applied after completely curing the depressed encapsulant material 15. The complex machining operation may be applied to remove sharp corners or edges and provide final surface finish to the encapsulant material 15, or modify the encapsulant profile to match with the deflection of the printhead wiper.

Relatively apparent advantages of the many embodiments include, but are not limited to: (1) lowering of distance between the nozzle plate and the topmost surface of the encapsulant material which may result in lowering of media gap on inkjet printers; (2) providing modification to encapsulant profile such as removing sharp corners and edges, and matching encapsulant profile with the deflection of a printhead wiper, which may result to less wear of printhead wiper and less occurrence of ink pooling on the nozzle plate surface; (3) lowering scrap rate of printhead assembly that is due to nonconformance of encapsulant material during production; and (4) allowing improvement of print quality of inkjet printers.

The foregoing illustrates various aspects of the disclosure. It is not intended to be exhaustive. Rather, it is chosen to provide the best illustration of the principles of the disclosure and its practical application to enable one of ordinary skill in the art to utilize the disclosure, including its various modifications that naturally follow. All modifications and variations are contemplated within the scope of the disclosure as determined by the appended claims. Relatively apparent modifications include combining one or more features of various embodiments with features of other embodiments.

The invention claimed is:

1. A method of controlling a height of an encapsulant material on an inkjet printhead having a heater chip electrically connected to a flexible circuit by way of a connecting wire extending above the heater chip and the flexible circuit, the method comprising:
   providing the inkjet printhead having an outer portion;
   dispensing to a first height the encapsulant material on the outer portion of the inkjet printhead, the encapsulant material covering a top surface of the heater chip and the flexible circuit and encapsulating the connecting wire, the first height rising above both the top surface of the heater chip and the connecting wire; and
   depressing the encapsulant material to a second height lower than the first height while maintaining the encapsulant material over the top surface of the heater chip and the connecting wire.

2. The method of claim 1, wherein the depressing of the encapsulant material includes depressing the encapsulant material to the second height directly after dispensing the encapsulant material on the outer portion of the inkjet printhead.

3. The method of claim 1, further including curing the encapsulant material dispensed on the outer portion of the inkjet printhead and depressing the encapsulant material after an initial cure stage.

4. The method of claim 1, further including curing the encapsulant material dispensed on the outer portion of the inkjet printhead and depressing the encapsulant material before the encapsulant material completely cures.

5. A method of controlling a height of an encapsulant material on an inkjet printhead having a heater chip electrically connected to a flexible circuit by way of a connecting wire extending above the heater chip and the flexible circuit, the method comprising:
   providing the inkjet printhead having an outer portion;
   dispensing to a first height the encapsulant material on the outer portion of the inkjet printhead, the encapsulant material covering a top surface of the heater chip and the flexible circuit and encapsulating the connecting wire, the first height rising above both the top surface of the heater chip and the connecting wire; and
   depressing the encapsulant material with a depressing plate to a second height lower than the first height while maintaining the encapsulant material over the top surface of the heater chip and the connecting wire.

6. The method of claim 5, wherein the depressing of the encapsulant material includes depressing a top surface of the encapsulant material with a flat bottom surface of the depressing plate.

7. The method of claim 5, wherein the depressing of the encapsulant material includes depressing a top surface of the encapsulant material with a shaped or patterned bottom surface of the depressing plate.

8. The method of claim 5, wherein the depressing of the encapsulant material includes depressing the encapsulant material with the depressing plate for a period of at most 1 minute.

9. The method of claim 5, wherein the depressing of the encapsulant material includes maintaining the depressing plate in contact with the encapsulant material during a curing stage of the encapsulant material.

10. The method of claim 5, further including chilling the depressing plate before depressing the encapsulant material.

11. The method of claim 5, further including removing the depressing plate from contact with the encapsulant material in a twisting or a sliding motion.

12. The method of claim 5, wherein the depressing of the encapsulant material further includes providing a sacrificial layer on the encapsulant material.

13. The method of claim 12, wherein the providing of the sacrificial layer includes providing a polytetrafluoroethylene film on the encapsulant material.

14. The method of claim 12, further including removing the sacrificial layer after a curing stage of the encapsulant material.

15. A method of controlling a height of an encapsulant material on an inkjet printhead having a heater chip electrically connected to a flexible circuit by way of a connecting wire extending above the heater chip and the flexible circuit, the method comprising:
   providing the inkjet printhead having an outer portion;
   dispensing to a first height the encapsulant material on the outer portion of the inkjet printhead, the encapsulant material covering a top surface of the heater chip and the flexible circuit and encapsulating the connecting wire, the first height rising directly above both the top surface of the heater chip and the connecting wire where the connecting wire attaches to the heater chip;
   curing the encapsulant material; and
   removing a top portion of the cured encapsulant material from an area directly above the top surface of the heater chip where the connecting wire attaches to the heater chip to control the encapsulant material to a second height lower than the first height while maintaining the encapsulant material over the top surface of the heater chip and the connecting wire.

16. The method of claim 15, wherein the dispensing of the encapsulant material includes dispensing the encapsulant material comprising about 1% to about 5% by weight of filler for increasing a shear strength of the encapsulant material.

17. The method of claim 15, wherein the dispensing of the encapsulant material includes dispensing the encapsulant material comprising fumed silica, boron nitride, arsenic pentoxide, arsenic trioxide, vanadium pentaoxide, barium oxide, or magnesium oxide as a filler for increasing a shear strength of the encapsulant material.

18. The method of claim 15, further including grinding the top portion of the cured encapsulant material to control the encapsulant material to the second height.

19. The method of claim 15, further including milling the top portion of the cured encapsulant material to control the encapsulant material to the second height.

20. The method of claim 15, further including depressing the encapsulant material directly after dispensing the encapsulant material on the outer portion of the inkjet printhead.

21. The method of claim 15, further including depressing the encapsulant material during the curing of the encapsulant material.

* * * * *